(12) United States Patent
Watanabe et al.

(10) Patent No.: US 7,727,859 B2
(45) Date of Patent: Jun. 1, 2010

(54) SEMICONDUCTOR DEVICE AND MANUFACTURING METHOD THEREOF

(75) Inventors: Yasuko Watanabe, Atsugi (JP); Junya Maruyama, Ebina (JP); Yoshitaka Moriya, Atsugi (JP)

(73) Assignee: Semiconductor Energy Laboratory Co., Ltd, Atsugi-shi, Kanagawa-ken ( * ) Notice: Subject to any disclaimer, the term of this patent is extended or adjusted under 35 U.S.C. 154(b) by 572 days.

(21) Appl. No.: 11/450,298

(22) Filed: Jun. 12, 2006

(65) Prior Publication Data
US 2007/0004125 A1 Jan. 4, 2007

(30) Foreign Application Priority Data
Jun. 30, 2005 (JP) .............................. 2005-193202

(51) Int. Cl.
*H01L 21/30* (2006.01)
(52) U.S. Cl. .................. 438/459; 438/456; 438/928; 438/959; 438/977
(58) Field of Classification Search ................ 438/456, 438/459, 928, 959, 977
See application file for complete search history.

(56) References Cited

U.S. PATENT DOCUMENTS

| 6,682,963 | B2 | 1/2004 | Ishikawa |
| 7,112,514 | B2 * | 9/2006 | Yasukawa .................... 438/459 |
| 7,253,083 | B2 * | 8/2007 | Clarke et al. ................. 438/459 |
| 7,456,051 | B2 * | 11/2008 | Yee et al. .................... 438/118 |

| 2002/0030189 | A1 | 3/2002 | Ishikawa |
| 2003/0213956 | A1 | 11/2003 | Hioki et al. |
| 2004/0164302 | A1 | 8/2004 | Arai et al. |
| 2005/0007540 | A1 | 1/2005 | Tsuboi et al. |
| 2005/0023525 | A1 | 2/2005 | Ishikawa |
| 2006/0202206 | A1 * | 9/2006 | Koyama et al. ................ 257/67 |

FOREIGN PATENT DOCUMENTS

| JP | 2002-164354 | 6/2002 |
| JP | 2004-282050 | 10/2004 |
| JP | 2005-003845 | 1/2005 |

OTHER PUBLICATIONS

Office Action (Application No. 200610101627.1) Dated Dec. 25, 2009.

* cited by examiner

*Primary Examiner*—Zandra Smith
*Assistant Examiner*—Christy L Novacek
(74) *Attorney, Agent, or Firm*—Eric J. Robinson; Robinson Intellectual Property Law Office, P.C.

(57) ABSTRACT

It is an object of the present invention to provide a semiconductor device in which a barrier property is improved; a compact size, a thin shape, and lightweight are achieved; and flexibility is provided. By providing a stacked body including a plurality of transistors in a space between a pair of substrates, a semiconductor device is provided, in which a harmful substance is prevented from entering and a barrier property is improved. In addition, by using a pair of substrates which are thinned by performing grinding and polishing, a semiconductor device is provided, in which a compact size, a thin shape, and lightweight are achieved. Further, a semiconductor device is provided, in which flexibility is provided and a high-added value is achieved.

9 Claims, 12 Drawing Sheets

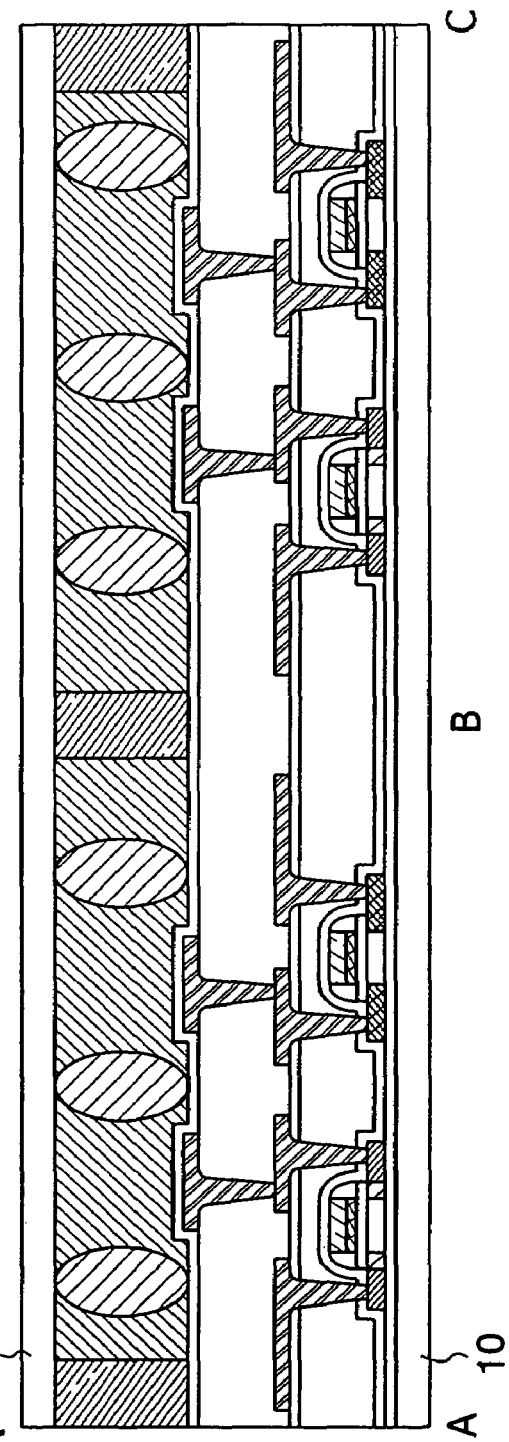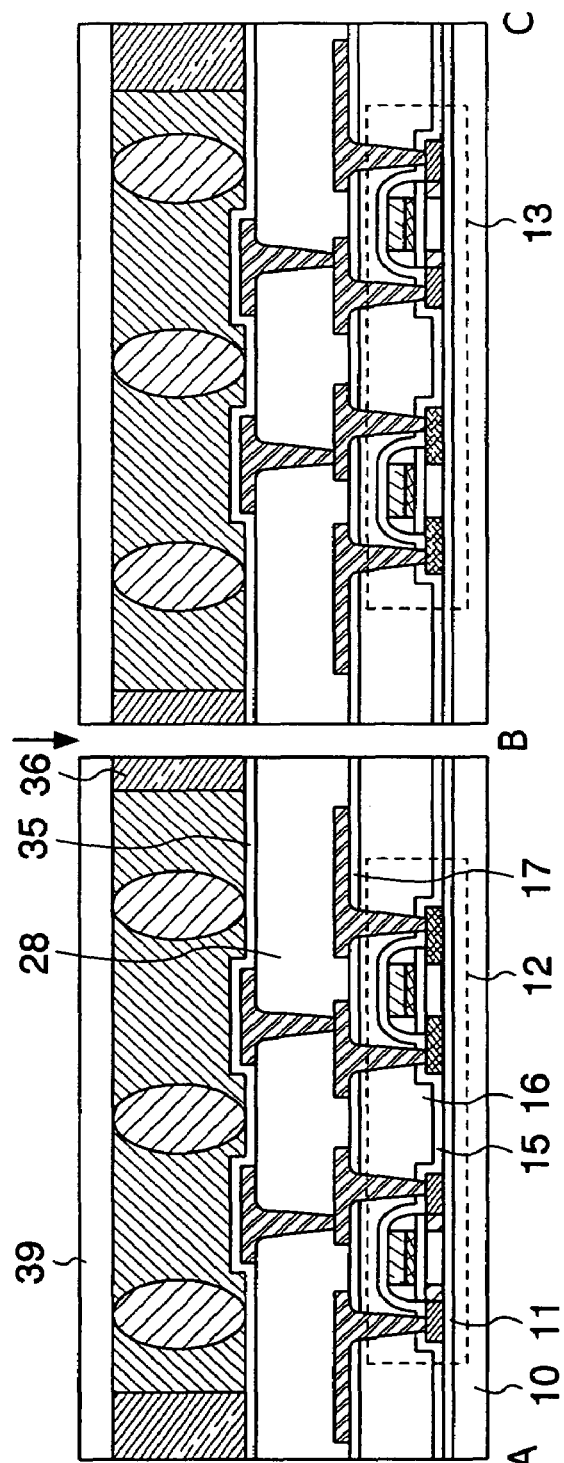
FIG.2A
FIG.2B

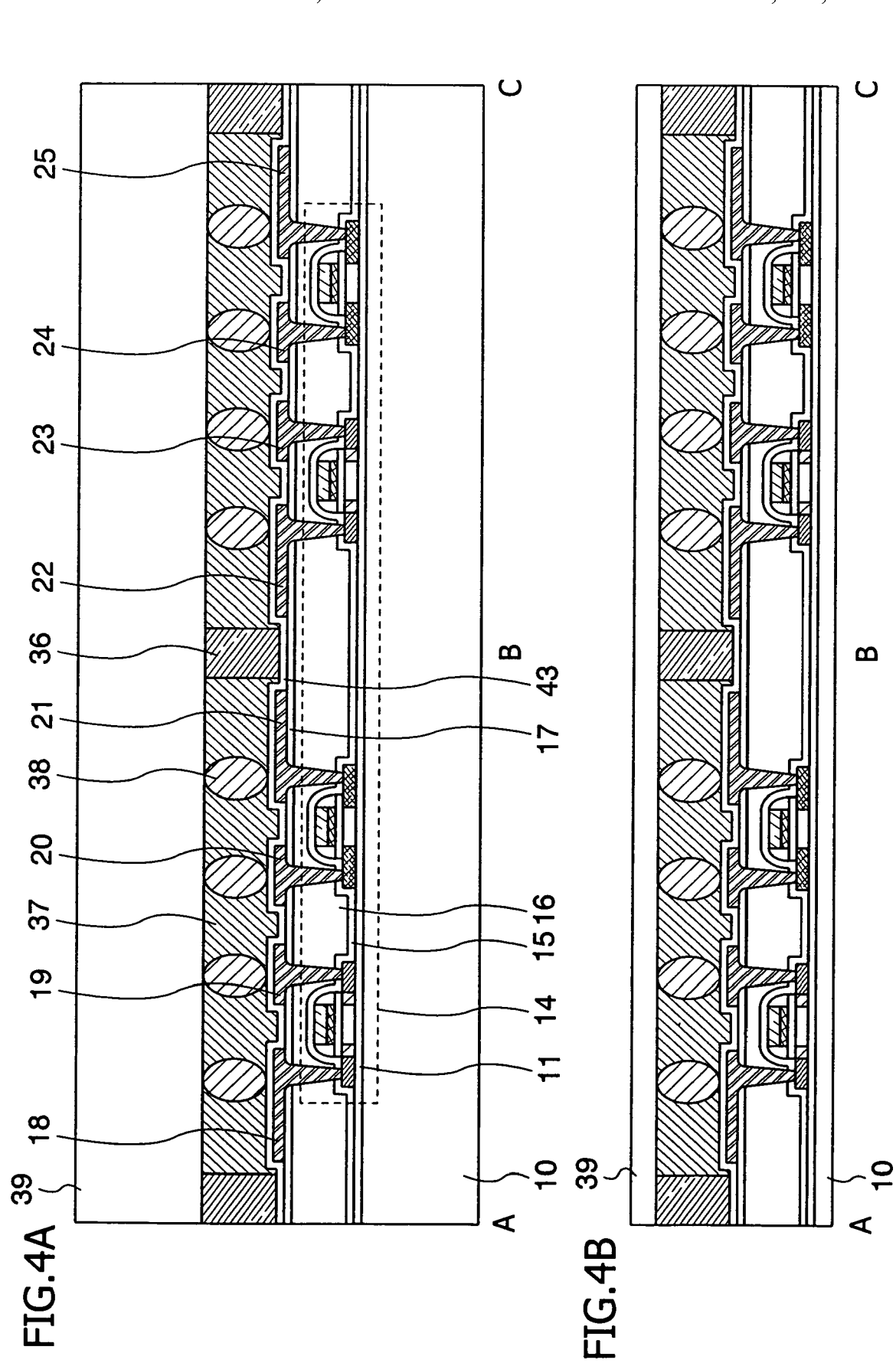

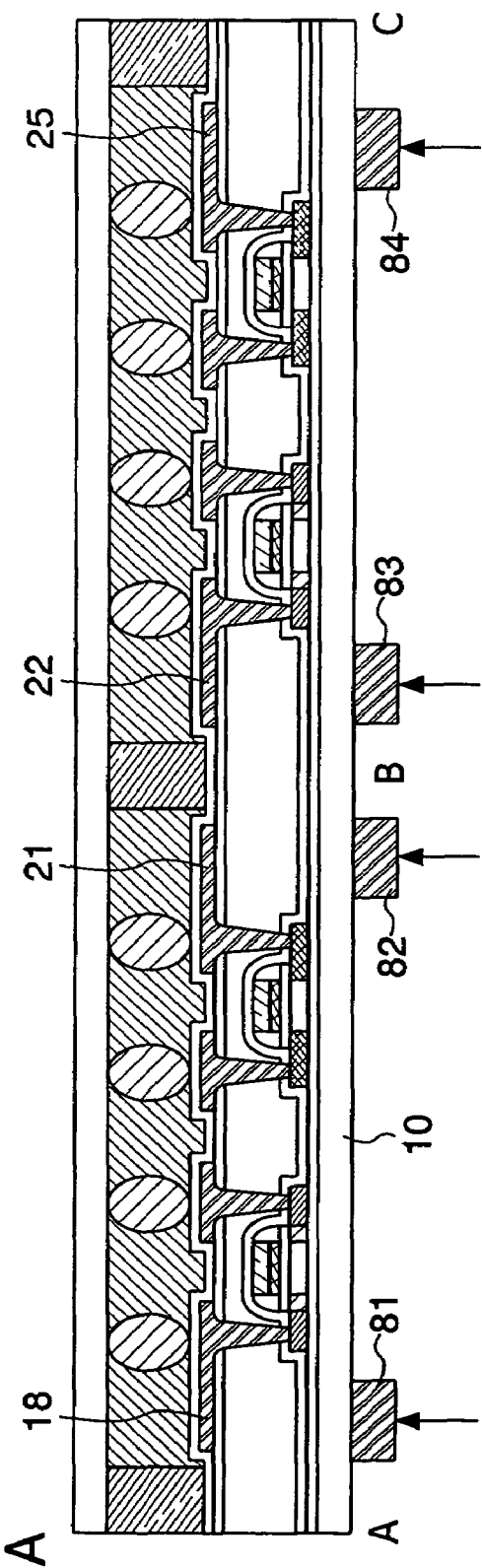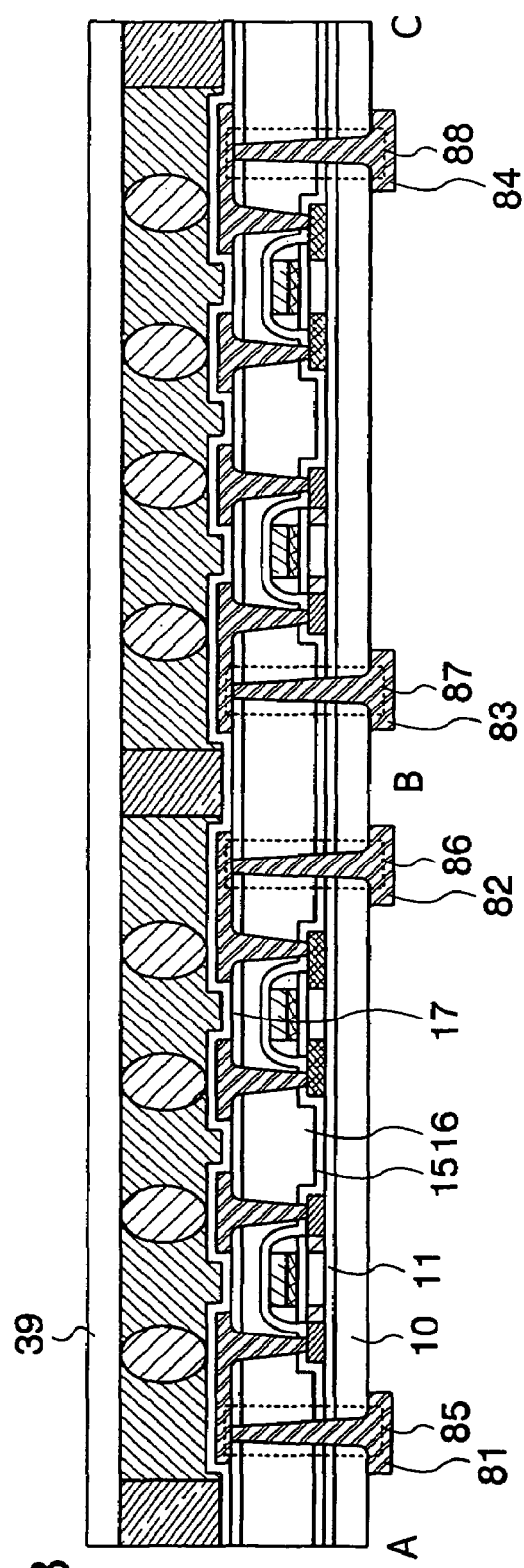
FIG.5A
FIG.5B 81  10  82  83  84

81  10  82  83  84

60  61  59  73  74

39  59

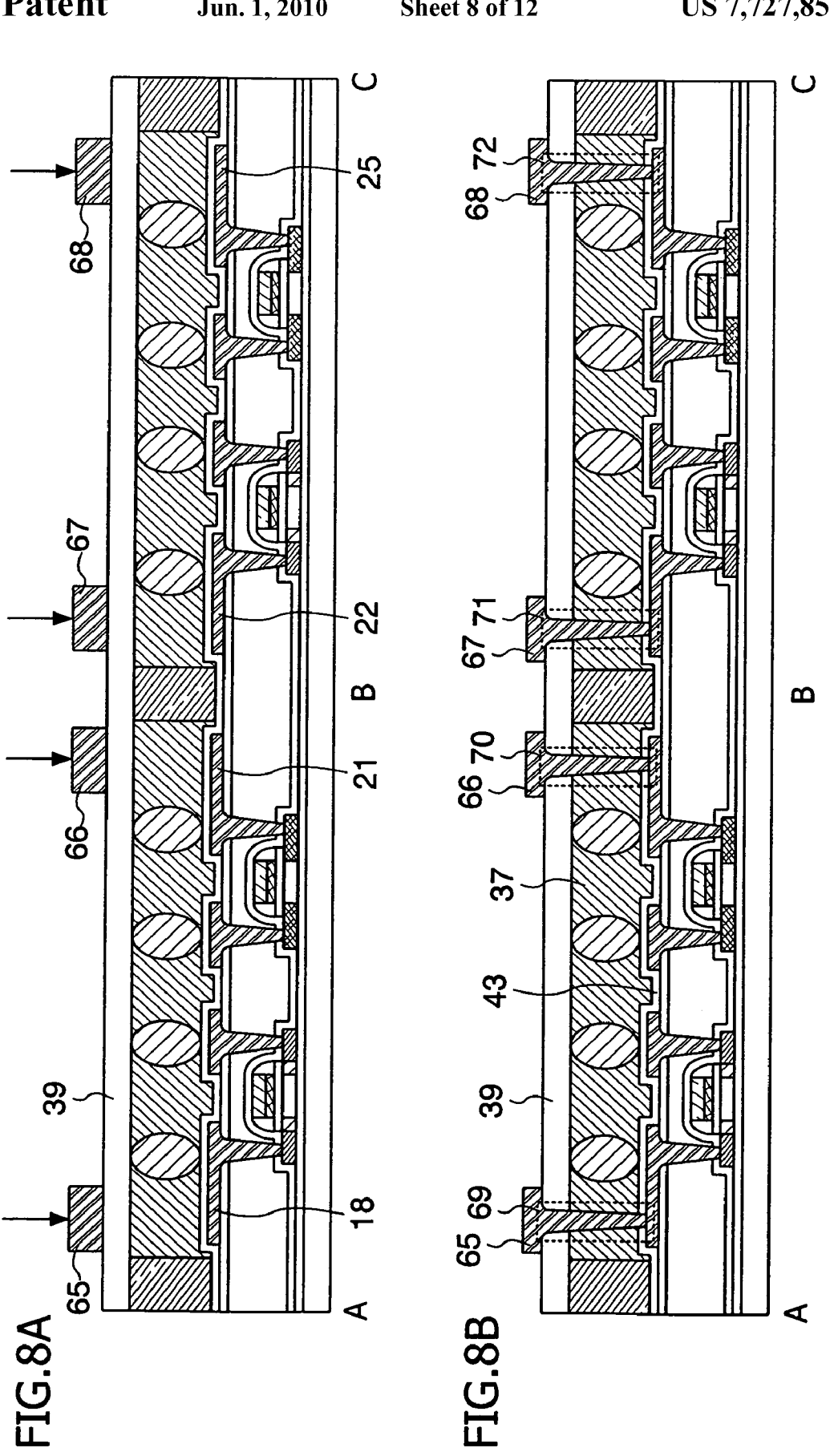

FIG.12A
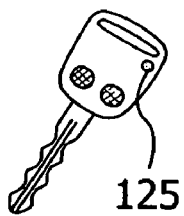
125
FIG.12B
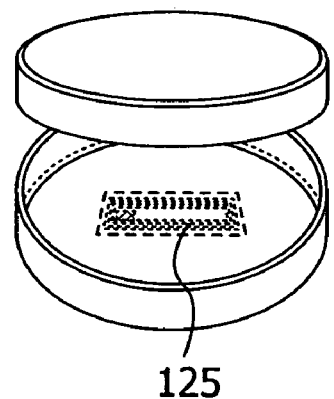
125
FIG.12C
125
FIG.12D
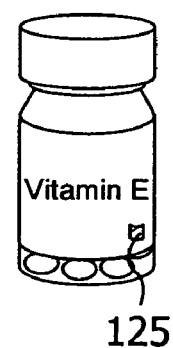
Vitamin E
125
FIG.12E
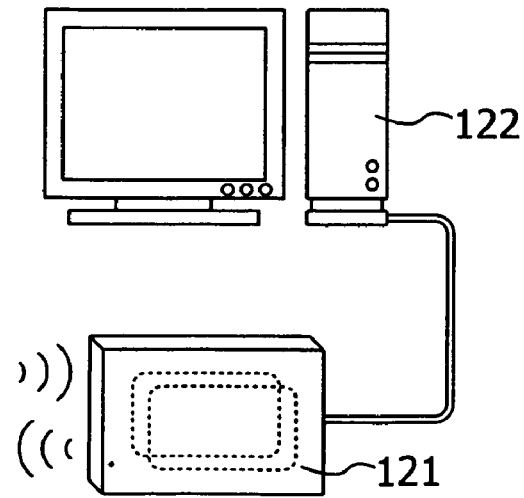
122
121
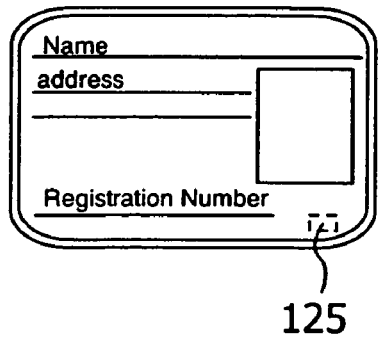
Name
address
Registration Number
125

SEMICONDUCTOR DEVICE AND MANUFACTURING METHOD THEREOF

BACKGROUND OF THE INVENTION

1. Field of the Invention

The present invention relates to a semiconductor device and a manufacturing method thereof. The semiconductor device corresponds to a semiconductor device including a transistor.

2. Description of the Related Art

A semiconductor device including a transistor has been developed. In particular, a semiconductor device capable of transmitting and receiving data without contact has been actively developed. Such a semiconductor device is called an RFID (Radio Frequency Identification), an RF chip, an RF tag, an IC chip, an IC tag, an IC label, a wireless chip, a wireless tag, an electronic chip, an electronic tag, a wireless processor, a wireless memory, or the like (Reference 1: Japanese Patent Laid-Open No. 2004-282050, for example), and it has been already introduced into some fields.

SUMMARY OF THE INVENTION

It is an object of the present invention to provide a semiconductor device in which reliability is improved by improving a barrier property.

In addition, it is another object of the present invention to provide a semiconductor device in which a high-added value is achieved by realizing a compact size, a thin shape, and lightweight.

Further, it is also an object of the present invention to provide a semiconductor device in which a high-added value is achieved by providing flexibility.

The present invention has a feature that a stacked body including a plurality of transistors is provided in a space between a pair of substrates. By this feature, a harmful substance can be prevented from entering, and a barrier property can be improved. Since a pair of substrates is superior in blocking a harmful substance which enters from the outside, a barrier property can be improved. In addition, by improving a barrier property, reliability can be improved.

In addition, the present invention has a feature that a pair of substrates which are thinned by performing grinding and polishing is used. By this feature, a semiconductor device in which a compact size, a thin shape, and lightweight are achieved can be provided.

Further, in the present invention, flexibility can be provided, and a high-added value can be achieved. Such flexibility is an added-value that is achieved by a thinned substrate.

A semiconductor device according to the present invention includes a transistor provided over a first substrate, a first insulating layer provided over the transistor, a first conductive layer (corresponding to a source wiring or a drain wiring) electrically connected to a source or a drain of the transistor through an opening provided in the first insulating layer, a second insulating layer provided over the first conductive layer, and a second substrate provided over the second insulating layer. The transistor includes a semiconductor layer, an insulating layer (corresponding to a gate insulating layer), and a conductive layer (corresponding to a gate electrode).

A semiconductor device according to the present invention includes a transistor provided over a first substrate, a first insulating layer provided over the transistor, a first conductive layer (corresponding to a source wiring or a drain wiring) electrically connected to a source or a drain of the transistor through an opening provided in the first insulating layer, a second insulating layer provided over the first conductive layer, a second conductive layer electrically connected to the first conductive layer through an opening provided in the second insulating layer, a third insulating layer provided over the second conductive layer, and a second substrate provided over the third insulating layer. The transistor includes a semiconductor layer, an insulating layer (corresponding to a gate insulating layer), and a conductive layer (corresponding to a gate electrode).

A semiconductor device according to the present invention includes a transistor which is provided over one surface of a first substrate and includes a semiconductor layer, a first insulating layer, and a first conductive layer; a second insulating layer provided over the transistor; a second conductive layer electrically connected to a source or a drain of the transistor through an opening provided in the second insulating layer; a first terminal portion provided in the same layer as the first conductive layer or the second conductive layer; a third insulating layer provided over the second insulating layer and the second conductive layer; a second substrate provided over the third insulating layer; a third substrate; a third conductive layer provided over one surface of the third substrate; a second terminal portion provided in the same layer as the third conductive layer; and a fourth conductive layer provided over the other surface of the first substrate.

In the semiconductor device having the above structure, the fourth conductive layer is electrically connected to the first terminal portion through an opening provided in the first substrate and the second insulating layer. The second terminal portion is electrically connected to the fourth conductive layer through one or both of an anisotropic conductive layer and a bump. The other surface of the first substrate and one surface of the third substrate are provided so as to be opposed to each other. The first terminal portion and the second terminal portion are provided so as to be overlapped with each other.

A semiconductor device according to the present invention includes a transistor which is provided over a first substrate and includes a semiconductor layer, a first insulating layer, and a first conductive layer; a second insulating layer provided over the transistor; a second conductive layer electrically connected to a source or a drain of the transistor through an opening provided in the second insulating layer; a first terminal portion provided in the same layer as the first conductive layer or the second conductive layer; a third insulating layer provided over the second insulating layer and the second conductive layer; a second substrate which is provided so that one surface thereof is in contact with the third insulating layer; a third substrate; a third conductive layer provided over one surface of the third substrate; a second terminal portion provided in the same layer as the third conductive layer; and a fourth conductive layer provided over the other surface of the second substrate.

In the semiconductor device having the above structure, the fourth conductive layer is electrically connected to the first terminal portion through an opening provided in the second substrate and the third insulating layer. The second terminal portion is electrically connected to the fourth conductive layer through one or both of an anisotropic conductive layer and a bump. The other surface of the second substrate and one surface of the third substrate are provided so as to be opposed to each other. The first terminal portion and the second terminal portion are provided so as to be overlapped with each other.

In the semiconductor device having the above structure, each of the first substrate and the second substrate is a glass substrate. In addition, a thickness of each of the first substrate and the second substrate is 100 μm or less, preferably 50 μm or less, and more preferably, 2 μm or more.

In addition, in the semiconductor device having the above structure, a sealing material is provided between the first substrate and the second substrate. In addition, in the semiconductor device having the above structure, a spacer is provided between the first substrate and the second substrate.

A method for manufacturing a semiconductor device according to the present invention includes a step of forming a transistor over one surface of a first substrate; a step of forming a first insulating layer over the transistor; a step of forming a first conductive layer electrically connected to a source or a drain of the transistor through an opening provided in the first insulating layer; a step of forming a second insulating layer over the first conductive layer; a step of providing a second substrate over the second insulating layer so that the surface of the second insulating layer is in contact with one surface of the second substrate; a step of grinding the other surface of the first substrate and the other surface of the second substrate; a step of polishing the other surface of the first substrate and the other surface of the second substrate, which are ground; and a step of forming a stacked body including the first substrate, the transistor, and the second substrate by cutting the first substrate, the first insulating layer, the second insulating layer, and the second substrate.

In addition to the above steps, the method includes a step of forming a semiconductor layer, an insulating layer (corresponding to a gate insulating layer), and a conductive layer (corresponding to a gate electrode) as a transistor.

A method for manufacturing a semiconductor device according to the present invention includes a step of forming a transistor over one surface of a first substrate; a step of forming a first insulating layer over the transistor; a step of forming a first conductive layer electrically connected to a source or a drain of the transistor through an opening provided in the first insulating layer; a step of forming a second insulating layer over the first conductive layer; a step of forming a second conductive layer electrically connected to the first conductive layer through an opening provided in the second insulating layer; a step of forming a third insulating layer over the second conductive layer; a step of providing a second substrate over the third insulating layer so that the surface of the third insulating layer is in contact with one surface of the second substrate; a step of performing one or both of grinding and polishing of the other surface of the first substrate and the other surface of the second substrate; and a step of forming a stacked body including the first substrate, the transistor, and the second substrate by cutting the first substrate, the first insulating layer, the second insulating layer, the third insulating layer, and the second substrate.

In addition to the above steps, the method includes a step of forming a semiconductor layer, an insulating layer (corresponding to a gate insulating layer), and a conductive layer (corresponding to a gate electrode) as a transistor.

A method for manufacturing a semiconductor device according to the present invention includes a step of forming a transistor including a semiconductor layer, a first insulating layer, and a first conductive layer over one surface of a first substrate; a step of forming a second insulating layer over the transistor; a step of forming a second conductive layer electrically connected to a source or a drain of the transistor through an opening provided in the second insulating layer and a first terminal portion provided in the same layer as the second conductive layer; a step of forming a third insulating layer over the second insulating layer, the second conductive layer, and the first terminal portion; a step of providing a second substrate over the third insulating layer so that the surface of the third insulating layer is in contact with one surface of the second substrate; a step of performing one or both of grinding and polishing of the other surface of the first substrate and the other surface of the second substrate; a step of forming a third conductive layer overlapping with the first terminal portion over the other surface of the first substrate; a step of forming an opening which exposes the first terminal portion and filling the opening with the third conductive layer by irradiating the third conductive layer with a laser beam; and a step of providing a third substrate so that the other surface of the first substrate and one surface of the third substrate provided with a second terminal portion and a fourth conductive layer are opposed to each other and the third conductive layer and the second terminal portion are electrically connected to each other.

A method for manufacturing a semiconductor device according to the present invention includes a step of forming a transistor including a semiconductor layer, a first insulating layer, and a first conductive layer over one surface of a first substrate; a step of forming a second insulating layer over the transistor; a step of forming a second conductive layer electrically connected to a source or a drain of the transistor through an opening provided in the second insulating layer and a first terminal portion provided in the same layer as the second conductive layer; a step of forming a third insulating layer over the second insulating layer, the second conductive layer, and the first terminal portion; a step of providing a second substrate over the third insulating layer so that the surface of the third insulating layer is in contact with one surface of the second substrate; a step of performing one or both of grinding and polishing of the other surface of the first substrate and the other surface of the second substrate; a step of forming a third conductive layer overlapping with the first terminal portion over the other surface of the second substrate; a step of forming an opening which exposes the first terminal portion and filling the opening with the third conductive layer by irradiating the third conductive layer with a laser beam; and a step of providing a third substrate so that the other surface of the second substrate and one surface of the third substrate provided with a second terminal portion and a fourth conductive layer are opposed to each other and the third conductive layer and the second terminal portion are electrically connected to each other.

In the method for manufacturing a semiconductor device according to the present invention, the other surface of the first substrate and the other surface of the second substrate are ground until the thicknesses of the first substrate and the second substrate become 100 μm or less. In addition, the other surface of the first substrate and the other surface of the second substrate, which are ground, are polished until the thicknesses of the first substrate and the second substrate become 50 μm or less.

In accordance with the present invention, in an element between a pair of substrates, a harmful substance can be prevented from entering, and deterioration of the element or breakdown of the element can be suppressed. Therefore, reliability can be improved. In addition, a substrate which is thinned by performing grinding and polishing is used, and thus, a semiconductor device in which a compact size, a thin shape, and lightweight are achieved can be provided. Further, since a thinned substrate is used, flexibility can be provided and a high-added value can be achieved.

BRIEF DESCRIPTION OF THE DRAWINGS

FIGS. 2A and 2B are views each explaining a semiconductor device of the present invention and a manufacturing method thereof;

FIGS. 4A and 4B are views each explaining a semiconductor device of the present invention and a manufacturing method thereof;

FIGS. 5A and 5B are views each explaining a semiconductor device of the present invention and a manufacturing method thereof;

FIGS. 8A and 8B are views each explaining a semiconductor device of the present invention and a manufacturing method thereof;

FIGS. 12A to 12E are views each explaining a semiconductor device of the present invention.

DESCRIPTION OF THE INVENTION

Figure 1:
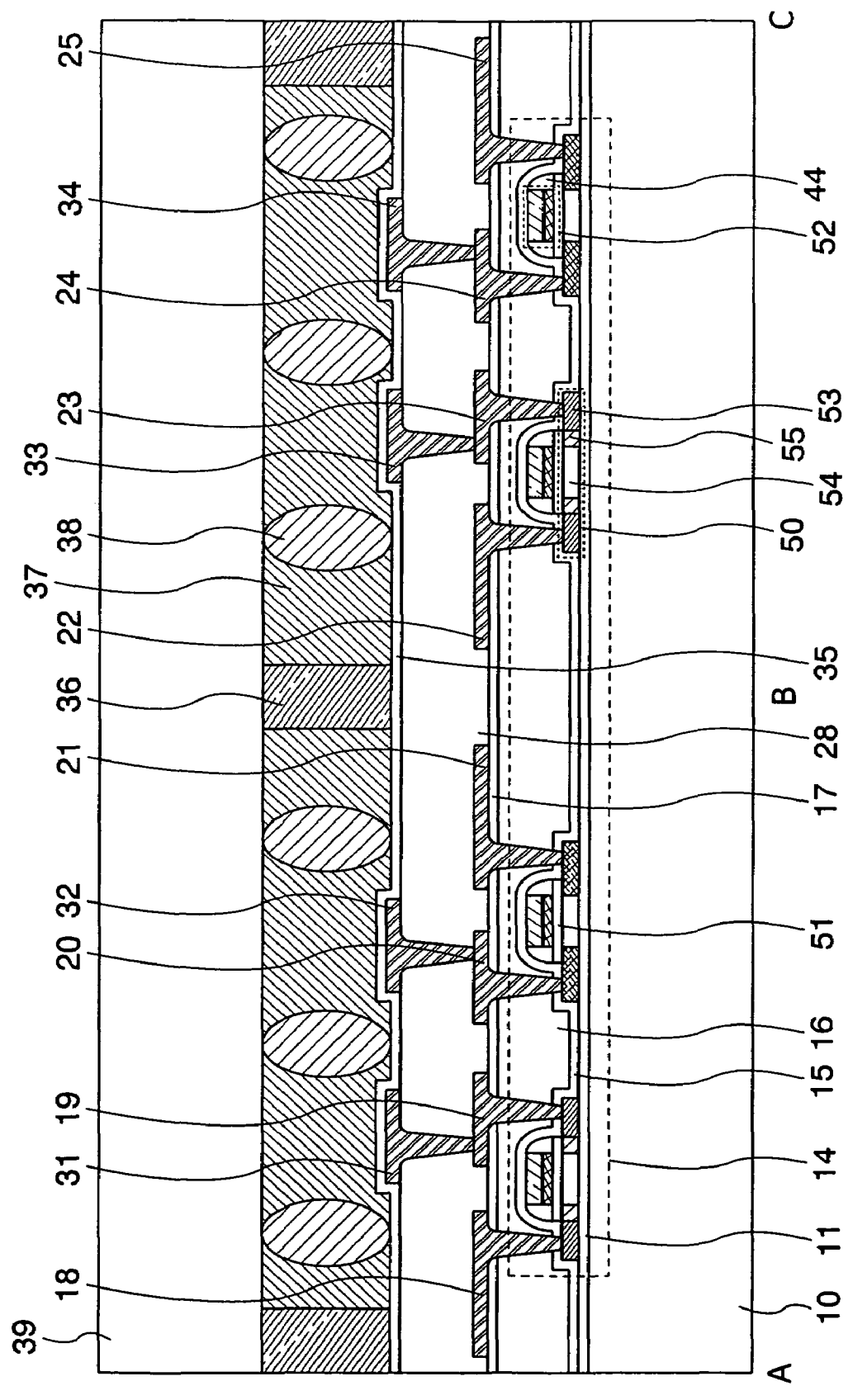
FIG. 1 is a view explaining a semiconductor device of the present invention and a manufacturing method thereof.

Embodiment modes of the present invention will be described in detail with reference to the accompanying drawings. It is to be noted that the present invention is not limited to a following description, and it is to be easily understood by those skilled in the art that modes and details thereof can be modified in various ways without departing from the purpose and the scope of the invention. Therefore, the present invention should not be interpreted as being limited to the description of the embodiment modes to be given below. Further, in a structure of the present invention, which will be described below, the same reference numerals are used for the same portions or portions having the same functions in different drawings.

Embodiment Mode 1

Figure 3A:
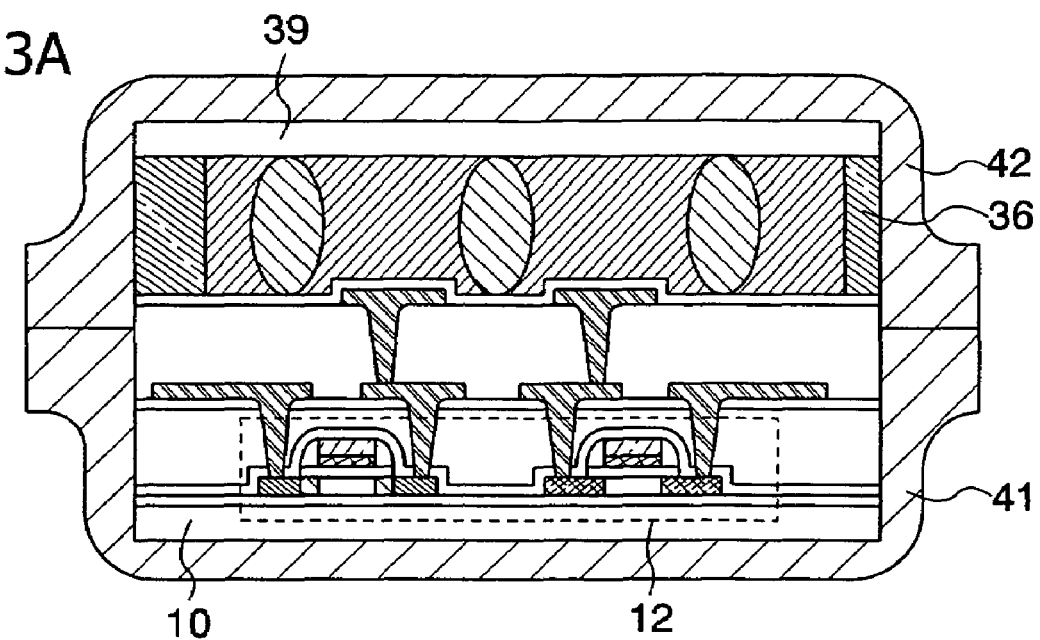
FIGS. 3A to 3C are views each explaining a semiconductor device of the present invention and a manufacturing method thereof.

A semiconductor device of the present invention will be described with reference to cross-sectional views of FIGS. 1, 2A and 2B, and 3A, and top views of FIGS. 3B and 3C. Each of FIGS. 1 and 2A corresponds to a cross-sectional view taken along a line A-C of the top view of FIG. 3B, and FIG. 2B corresponds to a cross-sectional view taken along a line A-C of the top view of FIG. 3C.

First, an insulating layer 11 is formed over one surface of a substrate 10 (refer to FIG. 1). The substrate 10 corresponds to a glass substrate, a plastic substrate, a silicon substrate, a quartz substrate, or the like. A glass substrate or a plastic substrate is preferably used as the substrate 10. This is because a glass substrate or a plastic substrate can be easily formed to have a size of 1 meter or more on one side, or can be easily formed to have a desired shape such as a rectangular shape. Therefore, for example, when a glass substrate or a plastic substrate that is rectangular and 1 meter or more on one side is used, productivity can be drastically enhanced. Such a merit is highly advantageous, compared with a case of using a silicon substrate that is circular and about 30 centimeters at maximum in diameter.

It is to be noted that a barrier film may be provided over only one surface of the substrate 10 or both surfaces of the substrate 10. As the barrier film, $Al_2O_3$, MgO, $SiO_2$, SiOx (x is 0 or more), Al, SiNx (x is 0 or more), SiOxNy (x and y are each 0 or more), or the like may be used. By providing the barrier film, a harmful substance included in the substrate 10 can be prevented from diffusing. Further, when a plastic substrate is used, either a substrate using a material in which glass and plastic are mixed or a substrate in which a layer formed of glass and a layer formed of plastic are stacked may be used.

As the insulating layer 11, oxide of silicon, nitride of silicon, oxide of silicon containing nitrogen, nitride of silicon containing oxygen, or the like is formed by a plasma CVD method, a sputtering method, or the like. The insulating layer 11 has a function of preventing an impurity element from the substrate 10 from entering an upper layer, and is not required to be formed if not necessary.

Then, a plurality of transistors 14 is formed over the insulating layer 11. Here, as the plurality of transistors 14, a plurality of thin film transistors is formed. Each of the plurality of transistors 14 has a semiconductor layer 50, a gate insulating layer (also referred to as an insulating layer) 51, and a conductive layer 52 which is a gate (also referred to as a gate electrode). The semiconductor layer 50 has impurity regions 53 and 55 functioning as a source (also referred to as a source electrode or a source region) or a drain (also referred to as a drain electrode or a drain region), and a channel forming region 54. An impurity element which imparts n-type or p-type conductivity is added to the impurity regions 53 and 55. Specifically, an impurity element which imparts n-type conductivity such as phosphorus (P) or arsenic (As), or an impurity element which imparts p-type conductivity such as boron (B) is added. The impurity region 55 is an IDD (Lightly Doped Drain) region.

In addition, in the shown structure, each of the plurality of transistors 14 has a sidewall 44. The sidewall 44 is in contact with a side surface of the conductive layer 52. The sidewall 44 is used as a mask for doping to form an LDD region. Each of the plurality of transistors 14 may be any of a top gate type in which the gate insulating layer 51 is provided over the semiconductor layer 50, and the conductive layer 52 is provided over the gate insulating layer 51; and a bottom gate type in which the gate insulating layer 51 is provided over the conductive layer 52, and the semiconductor layer 50 is provided over the gate insulating layer 51. Alternatively, each of the plurality of transistors 14 may be a multi gate transistor having two or more gate electrodes and two or more channel forming regions.

In addition, in the shown structure, only the plurality of transistors 14 is formed, but the present invention is not limited to this structure. An element provided over the substrate 10 may be appropriately determined depending on the application of the semiconductor device. For example, in a case where the semiconductor device has a function of transmitting and receiving data without contact, only a plurality of transistors may be formed over the substrate 10, or a plurality of transistors and a conductive layer functioning as an antenna may be formed over the substrate 10. Alternatively, in a case where the semiconductor device has a function of storing data, a plurality of transistors and a plurality of memory elements (for example, a transistor, a memory transistor, or the like) may be formed over the substrate 10. Further, in a case where the semiconductor device has a function of controlling a circuit, a function of generating a signal, or the like (for example, a CPU, a signal generating circuit, or the like), a plurality of transistors may be formed over the substrate 10. In addition to the above examples, other element such as a resistive element (a resistor) or a capacitor element (a capacitor) may be formed if necessary.

Next, insulating layers 15 to 17 are formed over the plurality of transistors 14. The insulating layers 15 to 17 are formed using oxide of silicon, nitride of silicon, a resin (polyimide, acrylic, or epoxy), or the like by a plasma CVD method, a sputtering method, an SOG (Spin On Glass) method, a droplet-discharge method, a screen printing method, or the like. Alternatively, the insulating layers 15 to 17 may be formed by using siloxane. Siloxane has a skeleton structure formed of, for example, a bond of silicon and oxygen. As a substituent, an organic group at least containing hydrogen (for example, an alkyl group or aromatic hydrocarbon) or a fluoro group, or both of an organic group at least containing hydrogen and a fluoro group are used. It is to be noted that, in the above structure, three insulating layers (15 to 17) are formed over the plurality of transistors 14, but the present invention is not limited to this structure. The number of insulating layers stacked over the plurality of transistors 14 is not particularly limited.

Subsequently, openings are formed in the insulating layers 15 to 17, and conductive layers 18 to 25 connected to a source or a drain of each of the plurality of transistors 14 are formed. The conductive layers 18 to 25 are formed as a single layer or a stacked layer of an element such as titanium (Ti) or aluminum (Al), or an alloy material or a compound material containing the element as its main component by a plasma CVD method, a sputtering method, or the like. Each of the conductive layers 18 to 25 functions as a source wiring or a drain wiring.

Then, an insulating layer 28 is formed over the insulating layer 17 and the conductive layers 18 to 25. The insulating layer 28 is formed by using a resin or the like.

Next, openings are formed in the insulating layer 28, and conductive layers 31 to 34 connected to the conductive layers 19, 20, 23 and 24, respectively, are formed. Each of the conductive layers 31 to 34 functions as an antenna. It is to be noted that a conductive layer functioning as an antenna is not required to be provided in the same layer as the conductive layers 31 to 34, and may be provided in the same layer as the conductive layer 52 that is a gate, or the same layer as the conductive layers 18 to 25, each of which is a source wiring or a drain wiring. In such a case, the conductive layers 31 to 34 are not required to be formed. In addition, a conductive layer functioning as an antenna may also be provided in a plurality of layers (for example, a plurality of layers selected from the same layer as the conductive layer 52, the same layer as the conductive layers 18 to 25, and the same layer as the conductive layers 31 to 34). It is to be noted that "the first layer provided in the same layer as the second layer" refers to "the first layer and the second layer are provided over the same layer".

Subsequently, an insulating layer 35 is formed over the insulating layer 28 and the conductive layers 31 to 34. The insulating layer 35 is formed using oxide of silicon or nitride of silicon by a plasma CVD method, a sputtering method, or the like.

Figure 3B:
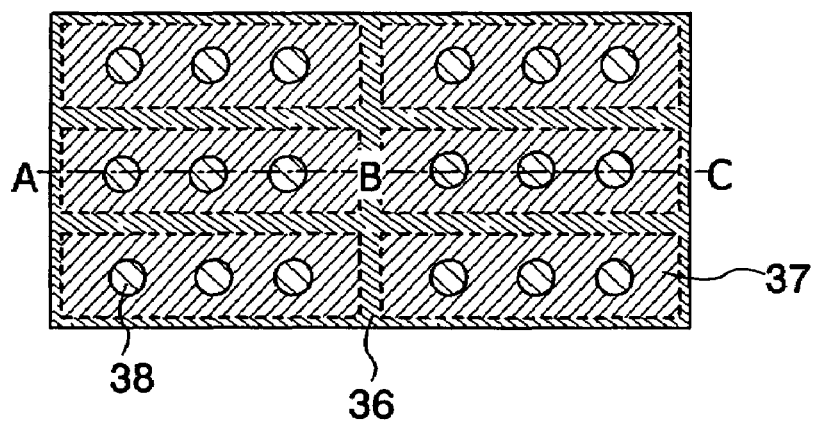
Figure 3C:
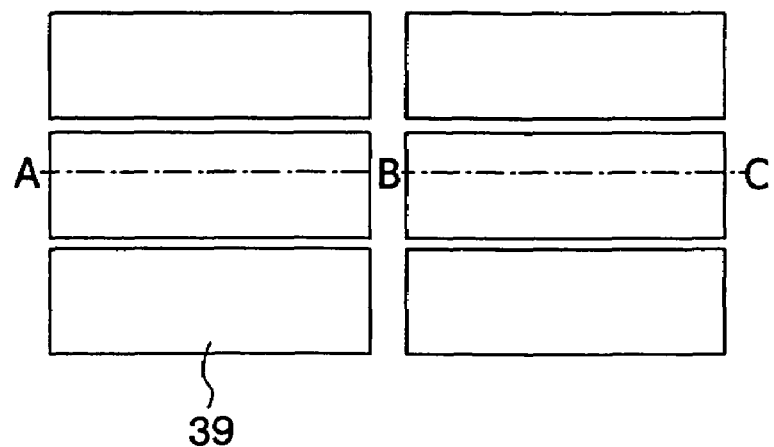

Then, a sealing material 36 is formed (refer to FIGS. 1 and 3B). The sealing material 36 is selectively formed in a predetermined portion by using a screen printing method, a method of drawing by a dispenser, or the like. The sealing material 36 is formed in a rectangular frame shape in many cases. The sealing material 36 is formed by using adhesive such as a thermosetting resin, an ultraviolet curable resin, vinyl acetate resin based adhesive, vinyl copolymer resin based adhesive, epoxy resin based adhesive, urethane resin based adhesive, rubber based adhesive, or acrylic resin based adhesive. In addition, a material in which a spacer is mixed into these materials may also be used as the sealing material 36.

Further, a material in which a fiber is mixed into the above adhesive material may also be used as the sealing material 36. The sealing material 36 is formed so as not to overlap with an element such as a transistor.

Next, an insulating layer 37 and a spacer 38 are formed in a space surrounded by the sealing material 36. The insulating layer 37 is formed using a resin, adhesive, or the like by a screen printing method or the like. In a case of forming the insulating layer 37 by using adhesive, the sealing material 36 is not required to be provided. Further, the spacer 38 has a shape such as a bead shape or a fiber shape and is formed by using a material such as a resin or silica. As the spacer 38, an insulating layer that is formed by using a photolithography method may also be used.

When the spacer 38 is formed by using a photolithography method, an organic insulating material such as photosensitive acrylic is patterned. By this method, the spacer 38 can be provided in a desired portion. One or both of the sealing material 36 and the spacer 38 have a function of keeping a distance between the substrate 10 and a substrate 39. Therefore, when the distance between the substrate 10 and the substrate 39 can be kept, one or both of the sealing material 36 and the spacer 38 are not required to be provided. In FIG. 3B, the sealing material 36, the spacer 38, and the insulating layer 37 are shown.

Then, the substrate 39 is provided over the insulating layer 37 and the spacer 38. The substrate 39 may be formed by using a material that is different from that of the substrate 10. For example, the substrate 10 may be a glass substrate, and the substrate 39 may be a plastic substrate. Thereafter, if necessary, the substrate 10 and the substrate 39 are attached to each other by using the sealing material 36. At this time, if necessary, one or both of pressure treatment and heat treatment are performed by a pressure bonding machine or the like.

It is to be noted that a barrier film may be provided over only one surface of the substrate 39 or both surfaces of the substrate 39. As the barrier film, $Al_{2O3}$, $MgO$, $SiO_2$, SiOx (x is 0 or more), Al, SiNx (x is 0 or more), SiOxNy (x and y are each 0 or more), or the like may be used. By providing the barrier film, a harmful substance included in the substrate 39 can be prevented from diffusing. In addition, the insulating layer 37 may also be injected between a pair of the substrates by a vacuum injection method after attaching the pair of the substrates.

Next, by a grinding means, the other surface of the substrate 10 and the other surface of the substrate 39 are ground (refer to FIG. 2A). It is preferable to grind the substrates 10 and 39 so as to each have a thickness of 100 μm or less. In a grinding step, one or both of a stage on which the substrates 10 and 39 are fixed and the grinding means are rotated, and the surfaces of the substrates 10 and 39 are ground. The grinding means corresponds to, for example, a grinding-polishing stone.

Next, by a polishing means, the other surface of the substrate 10 and the other surface of the substrate 39, which are ground, are polished. It is preferable to polish the substrates 10 and 39 so as to each have a thickness of 2 μm or more and 50 μm or less, preferably 4 μm or more and 20 μm or less, for example, they are polished to each have a thickness of 5 μm or less. Also in this polishing step, similarly to the above grinding step, one or both of a stage on which the substrates 10 and 39 are fixed and the polishing means are rotated, and the surfaces of the substrates 10 and 39 are polished. The polishing means corresponds to, for example, a grinding-polishing stone, a polishing pad, or a polishing abrasive grain (such as cerium oxide). It is to be noted that, after the grinding step and the polishing step, one or both of a cleaning step for removing dusts and a drying step are performed if necessary.

Thicknesses of the substrates 10 and 39 after polishing may be appropriately determined in consideration of time required for the grinding step and the polishing step, time required for a cutting step that will be carried out later, an application of a semiconductor device, the strength required for the application, and the like. For example, in a case where productivity is improved by shortening time for the grinding step and the polishing step, the thicknesses of the substrates 10 and 39 after polishing may be set to be about 50 μm. In addition, in a case where productivity is improved by shortening time required for a cutting step that will be carried out later, the thicknesses of the substrates 10 and 39 after polishing may be set to be 2 μm or more and 20 μm or less. In addition, when a semiconductor device is attached to or embedded in a thin product, the thicknesses of the substrates 10 and 39 after polishing may be set to be 2 μm or more and 20 μm or less.

It is to be noted that both of grinding and polishing are performed in the above steps; however, when the substrates can have desired thicknesses by only a grinding step or a polishing step, only either one of a grinding step and a polishing step may be performed.

Subsequently, the substrate 10, the insulating layers 11, 15 to 17, 28, and 35, the sealing material 36, and the substrate 39 are cut (refer to FIGS. 2B and 3C). Then, a semiconductor device including the substrate 10, a plurality of transistors 12, and the substrate 39, or a semiconductor device including the substrate 10, a plurality of transistors 13, and the substrate 39 can be completed. A laser irradiation apparatus, a dicing apparatus, a scribing apparatus, or the like is used for cutting.

It is to be noted that either a laser irradiation apparatus or a dicing apparatus may be used in the above cutting step (dividing step); however, it is preferable to use a different apparatus properly depending on a size of a semiconductor device. In many cases, a laser irradiation apparatus can cut a semiconductor device into a minute size. Therefore, a laser irradiation apparatus may be used for a semiconductor device with a compact size, and a dicing apparatus may be used for a semiconductor device with a middle and large size.

It is to be noted that a laser irradiation apparatus is preferably used in this cutting step. A laser is formed by a laser medium, an excitation source, and a resonator. When lasers are classified in accordance with a medium, there are a gas laser, a liquid laser, and a solid state laser. Further, when lasers are classified in accordance with characteristics of oscillation, there are a free electron laser, a semiconductor laser, and an X-ray laser. In the present invention, any of the above lasers may be used. It is preferable to use a gas laser or a solid state laser, and it is more preferable to use a solid state laser.

As a gas laser, a helium-neon laser, a carbon dioxide laser, an excimer laser, and an argon-ion laser are given. As an excimer laser, a rare gas excimer laser and a rare gas halide excimer laser are given. As for a rare gas excimer laser, there are oscillations by three kinds of excited molecules of argon, krypton, and xenon. As an argon-ion laser, a rare gas ion laser and a metal vapor ion laser are given. As a liquid laser, an inorganic liquid laser, an organic chelate laser, and a dye laser are given. In an inorganic liquid laser and an organic chelate laser, a rare earth ion such as neodymium used in a solid state laser is utilized as a laser medium. A laser medium used in a solid state laser is a solid base doped with activated species having laser effect. The solid base is crystal or glass. The crystal is YAG (yttrium aluminum garnet crystal), YLF, $YVO_4$, $YAlO_3$, sapphire, ruby, or alexandrite. In addition, the activated species having laser effect are, for example, trivalent ions ($Cr^{3+}$, $Nd^{3+}$, $Yb^{3+}$, $Tm^{3+}$, $Ho^{3+}$, $Er^{3+}$, and $Ti^{3+}$).

A continuous wave laser beam or a pulsed laser beam can be used in the present invention. Irradiation conditions of a laser beam such as frequency, power density, energy density, and a beam profile are appropriately controlled in consideration of a thickness of a stacked body including a plurality of transistors.

In a step of irradiation of the above laser beam, ablation processing is used. In the ablation processing, a phenomenon is used, in which a molecular bond in a portion irradiated with a laser beam, that is, a portion which has absorbed a laser beam, is cut, photolyzed, vaporized, and evaporated. In other words, in the present invention, a molecular bond in a portion of the substrate 10, the insulating layers 11, 15 to 17, 28, and 35, the sealing material 36, and the substrate 39 is cut, photolyzed, vaporized, and evaporated by the laser beam irradiation.

Further, as a laser, a solid state laser with a wavelength of 1 to 380 nm that is an ultraviolet ray region may be used. Preferably, an Nd:$YVO_4$ laser with a wavelength of 1 to 380 nm is used. This is because, as for the Nd:$YVO_4$ laser with a wavelength of 1 to 380 nm, light is easily absorbed in the substrate compared with other laser on longer wavelength side, and ablation processing is possible. In addition, the periphery of a processed portion is not affected and processability is favorable.

It is to be noted that, in the semiconductor device having the above structure (refer to FIG. 2B), a stacked body including the plurality of transistors 12 may be further sealed with a substrate (refer to FIG. 3A). Specifically, a substrate may be newly provided over one or both of the surfaces of the substrates 10 and 39. In the shown structure, a substrate 41 is provided over the surface of the substrate 10, and a substrate 42 is provided over the surface of the substrate 39, and thus, the stacked body including the plurality of transistors 12 is sealed with the substrates 41 and 42. By sealing the stacked body with the substrates 41 and 42, the strength can be enhanced.

Each of the substrates (also referred to as a base, a film, or a tape) 41 and 42 is a substrate having flexibility. Each of the substrates 41 and 42 is formed by using a material such as polyethylene, polypropylene, polystyrene, an AS resin, an ABS resin (a resin obtained by polymerization of acrylonitrile, butadiene and styrene), a methacrylic resin (also referred to as acrylic), polyvinyl chloride, polyacetal, polyamide, polycarbonate, denatured polyphenylene ether, polybutylene terephthalate, polyethylene terephthalate, polysulfone, polyethersulfone, polyphenylene sulfide, polyamideimide, polymethylpentene, a phenol resin, a urea resin, a melamine resin, an epoxy resin, a diallyl phthalate resin, an unsaturated polyester resin, polyimide, or polyurethane, or a fiber material (for example, paper). A film may be a single layer film or a stacked film including a plurality of films. Further, over the surface, an adhesive layer may be provided. The adhesive layer corresponds to a layer containing adhesive.

The surface of each of the substrates 41 and 42 may be coated with powder of silicon dioxide (silica). By coating, a water proof property can be maintained also under a circumstance of a high temperature and high humidity. In addition, the surface may also be coated with a conductive material such as indium tin oxide. The coating material charges static electricity, and the stacked body including the thin film transistors can be protected from static electricity. In addition, the surface may also be coated with a material containing carbon as its main component (for example, diamond like carbon). The strength can be enhanced by coating, and deterioration or breakdown of a semiconductor device can be suppressed. Further, the substrates 41 and 42 may also be formed by using a material in which a base material (such as a resin) is mixed with silicon dioxide, a conductive material, or a material containing carbon as its main component. Sealing of the stacked body including the plurality of transistors 12 with the substrate 41 and 42 is carried out by melting a layer over the surface of each of the substrates 41 and 42 or an adhesive layer over the surface of each of the substrates 41 and 42 by heat treatment. If necessary, pressure treatment may be performed.

The present invention has a feature that the stacked body including the plurality of transistors 12 is provided in a space between the substrates 10 and 39. By this feature, a harmful substance can be prevented from entering, and a barrier property can be improved. Therefore, reliability can be improved.

In addition, a thickness of each of the substrates 10 and 39 is preferably 100 µm or less, more preferably 50 µm or less, and further preferably 20 µm or less. In this manner, the present invention has a feature of using a pair of substrates which are thinned by performing a grinding step and a polishing step. By this feature, a compact size, a thin shape, and lightweight can be achieved in a semiconductor device. Further, flexibility can be provided and a high-added value can be achieved.

It is to be noted that a glass substrate is preferably used as the substrate. This is because a glass substrate has a high barrier property to oxygen, water vapor, or the like. In addition, as compared with a plastic substrate, a chemical resistant property and a solvent resistant property of a glass substrate are excellent.

It is to be noted that, in the above manufacturing steps, an example of forming the thin film transistor over the substrate is shown; however, the present invention is not limited to this example. A transistor with a semiconductor substrate (a silicon substrate) as a channel portion may be formed, and another substrate may be provided to be opposed to the semiconductor substrate. Then, the semiconductor substrate and the substrate may be thinned.

Embodiment Mode 2

Another embodiment mode of the present invention will be explained with reference to cross-sectional views of FIGS. 4A and 4B, 5A and 5B, and 6A to 6C, and top views of FIGS. 7A to 7D. Each of FIGS. 5A and 5B corresponds to a cross-sectional view taken along a line A-C of the top view of FIG. 7A, and FIG. 6A corresponds to a cross-sectional view taken along a line A-C of the top view of FIG. 7B. In addition, FIG. 6B corresponds to a cross-sectional view taken along a line A-B of the top view of FIG. 7D.

First, an insulating layer 11 is formed over one surface of a substrate 10 (refer to FIG. 4A). Then, a plurality of transistors 14 is formed over the insulating layer 11, and insulating layers 15 to 17 are formed over the plurality of transistors 14. Subsequently, openings are formed in the insulating layers 15 to 17, and conductive layers 18 to 25 connected to a source or a drain of each of the plurality of transistors 14 are formed.

Subsequently, an insulating layer 43 is formed over the insulating layer 17 and the conductive layers 18 to 25. The insulating layer 43 is formed using oxide of silicon or nitride of silicon by a plasma CVD method, a sputtering method, or the like. Then, a sealing material 36 is formed. In a space surrounded by the sealing material 36, an insulating layer 37 and a spacer 38 are formed. A substrate 39 is provided over the insulating layer 37 and the spacer 38. At this time, the substrate 39 is provided so that the insulating layer 37 is in contact with one surface of the substrate 39. Then, the substrates 10 and 39 are attached to each other with the sealing material 36.

Next, by a grinding means, the other surface of the substrate 10 and the other surface of the substrate 39 are ground (refer to FIG. 4B). Thereafter, by a polishing means, the other surface of the substrate 10 and the other surface of the substrate 39, which are ground, are polished.

Figure 7A:
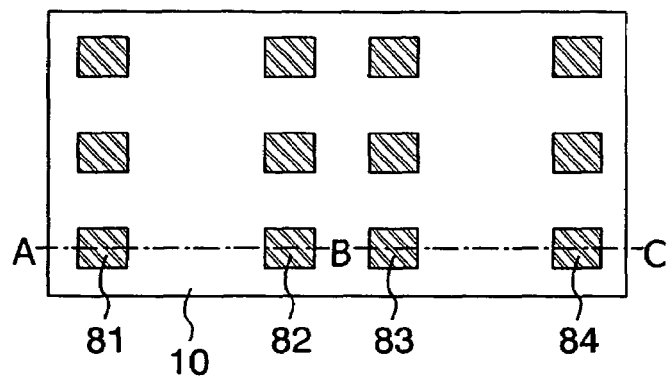
FIGS. 7A to 7D are views each explaining a semiconductor device of the present invention and a manufacturing method thereof.

Then, over the other surface of the substrate 10, conductive layers 81 to 84 are formed (refer to FIGS. 5A and 7A). The conductive layers 81 to 84 are formed by a sputtering method, a CVD method, a droplet-discharge method, a screen printing method, or the like. In addition, the conductive layers 81 to 84 are formed by using aluminum (Al), a material containing aluminum as its main component, copper (Cu), a material containing copper as its main component, or an alloy material thereof to have a thickness of 0.3 to 2 µm. Further, an alloy material including one or a plurality of elements selected from germanium (Ge), tin (Sn), gallium (Ga), zinc (Zn), lead (Pb), indium (In), scandium (Sb), and the like, and Al and Cu may also be used. When an alloy material mixed with such an element is used, a melting point is lowered, and a processing temperature in a subsequent reflow step can be lowered. In addition, the conductive layers 81 to 84 are formed so as to overlap with the conductive layers 18, 21, 22 and 25, respectively.

Subsequently, the conductive layers 81 to 84 are irradiated with a laser beam (refer to FIGS. 5B and 7A). By laser beam irradiation, the conductive layers 81 to 84 are fluidized (reflowed), and at the same time, openings 85 to 88 are formed in the substrate 10, and the insulating layers 11, and 15 to 17. The openings 85 to 88 are filled with the conductive layers 81 to 84, respectively. In this manner, the conductive layers 81 to 84 are electrically connected to the conductive layers 18, 21, 22, and 25. Portions, which are part of the conductive layers 18, 21, 22, and 25 and connected to the conductive layers 81 to 84, are each also referred to as a terminal portion.

It is to be noted that treatment for heating the conductive layers 81 to 84 may also be performed by rapid thermal annealing (RTA) instead of laser beam irradiation. Rapid thermal annealing is treatment in which, under an inert gas atmosphere, an infrared lamp or a halogen lamp emitting ultraviolet ray to infrared ray is used to increase a temperature rapidly, and heat is applied momentarily for several micro seconds to several minutes. In both of the above methods, at least the conductive layers 81 to 84 are made to be at a recrystallization temperature or higher so as to have fluidity.

Figure 6A:
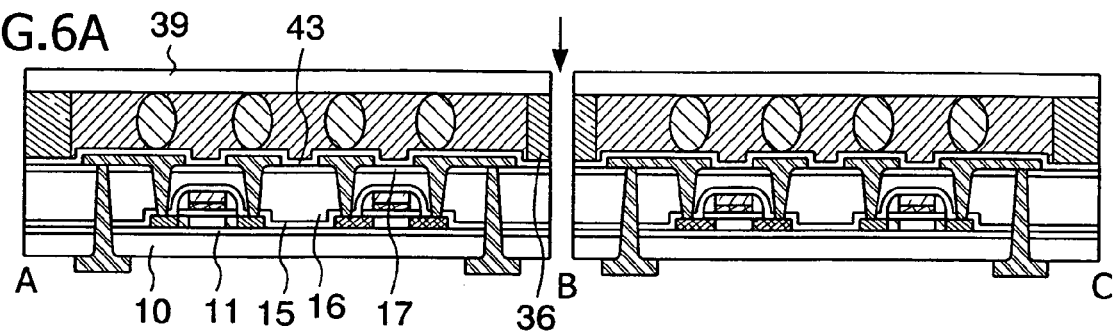
FIGS. 6A to 6C are views each explaining a semiconductor device of the present invention and a manufacturing method thereof.
Figure 7B:
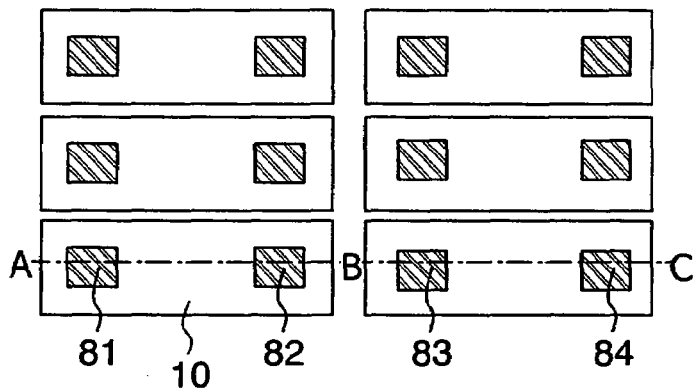

Next, the substrate 10, the insulating layers 11, 15 to 17, and 43, the sealing material 36, and the substrate 39 are cut by laser beam irradiation (refer to FIGS. 6A and 7B).

Figure 6B:
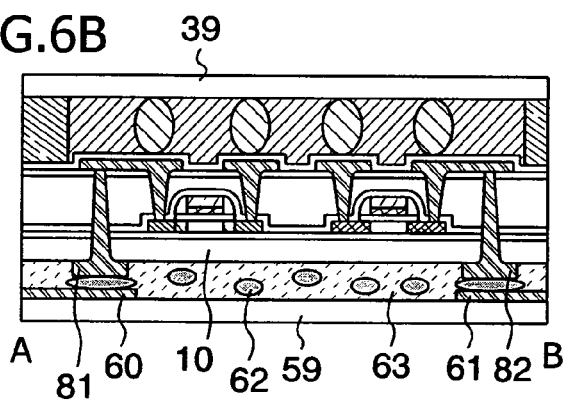
Figure 6C:
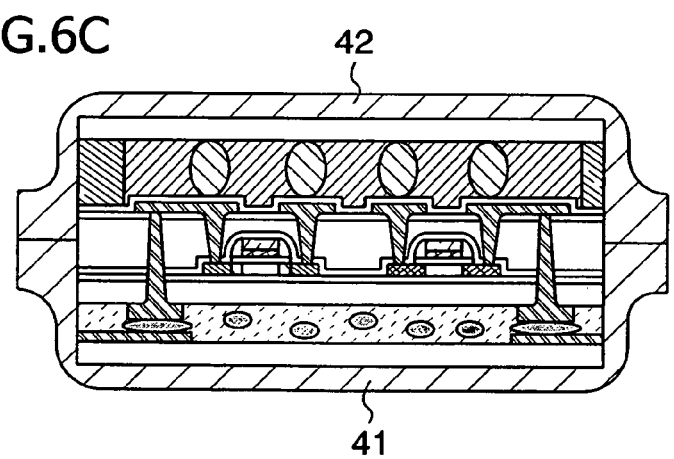
Figure 7C:
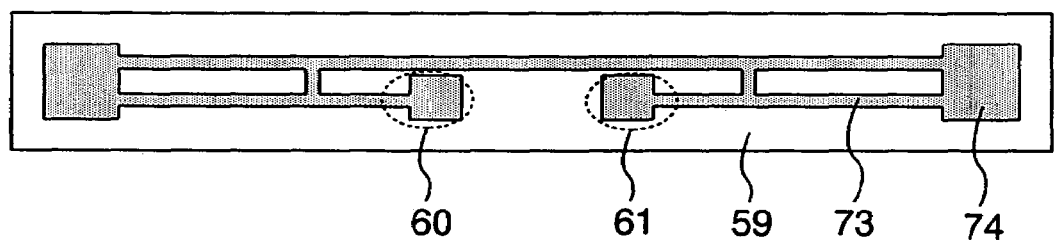

Then, a substrate 59 provided with an antenna 73 and a capacitor element 74 is prepared (refer to FIG. 7C). Each of the antenna 73 and the capacitor element 74 is formed by using a screen printing method, a droplet-discharge method, a photolithography method, a sputtering method, a CVD method, or the like. FIGS. 6B and 6C show conductive layers 60 and 61, each of which is part of the antenna 73.

Figure 7D:
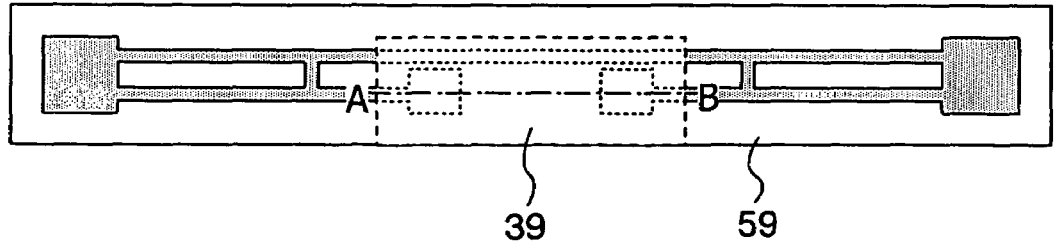

Then, the substrate 59 is provided over the substrate 10 so that the conductive layers 81 and 82 are electrically connected to the conductive layers 60 and 61 over the substrate 59 (refer to FIGS. 6B and 7D). Portions, which are part of the conductive layers 60 and 61 and connected to the conductive layers 81 and 82, are each also referred to as a terminal portion. In the shown structure, a layer 63 (corresponding to an anisotropic conductive layer) containing a conductive particle 62 is provided between the conductive layers 81 and 82 and the conductive layers 60 and 61. However, the present invention is not limited to this structure, and one or both of a bump (protruded electrode) and an anisotropic conductive layer may be provided between the conductive layers 81 and 82 and the conductive layers 60 and 61.

In addition, in the semiconductor device having the above structure (refer to FIG. 6B), a stacked body including a plurality of transistors 14 may be sealed with a substrate (refer to FIG. 6C). In the shown structure, a substrate 41 is provided over the surface of the substrate 59, and a substrate 42 is provided over the surface of the substrate 39, and thus, the stacked body including the plurality of transistors 14 is sealed with the substrates 41 and 42.

Embodiment Mode 3

In the above embodiment mode, the conductive layers 81 to 84 are formed over the other surface of the substrate 10; however, the present invention is not limited to this mode. Conductive layers 65 to 68 may be formed over the other surface of the substrate 39 (refer to FIG. 8A). The conductive layers 65 to 68 are formed so as to overlap with the conductive layers 18, 21, 22, and 25, respectively.

Subsequently, the conductive layers 65 to 68 are irradiated with a laser beam (refer to FIG. 8B). By laser beam irradiation, the conductive layers 65 to 68 are fluidized, and at the same time, openings 69 to 72 are formed in the substrate 39, and insulating layers 37 and 43. Then, the openings 69 to 72 are filled with the conductive layers 65 to 68, respectively. The conductive layers 65 to 68 are electrically connected to the conductive layers 18, 21, 22, and 25.

Figure 9A:
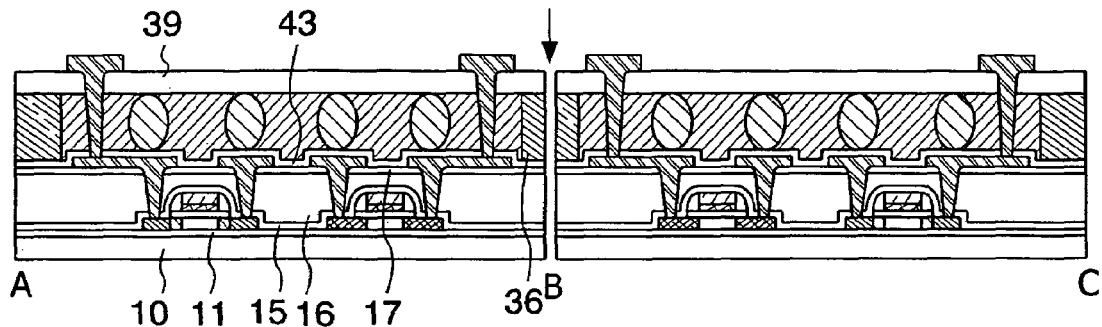
FIGS. 9A to 9C are views each explaining a semiconductor device of the present invention and a manufacturing method thereof.

Next, by laser beam irradiation, the substrate 10, the insulating layers 11, 15 to 17, and 43, a sealing material 36, and the substrate 39 are cut (refer to FIG. 9A).

Figure 9B:
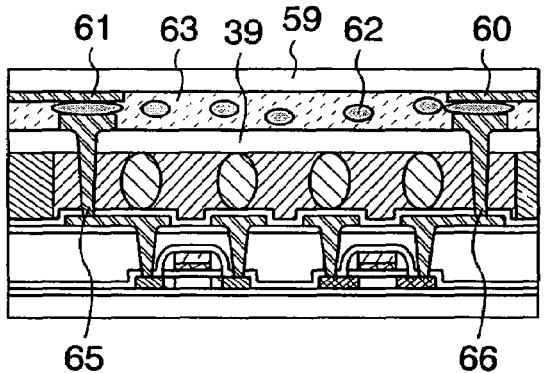

Then, a substrate 59 is provided over the substrate 39 so that the conductive layers 65 and 66 are electrically connected to conductive layers 60 and 61 over the substrate 59 (refer to FIG. 9B). In the shown structure, a layer 63 containing a conductive particle 62 is provided between the conductive layers 65 and 66 and the conductive layers 60 and 61.

Figure 9C:
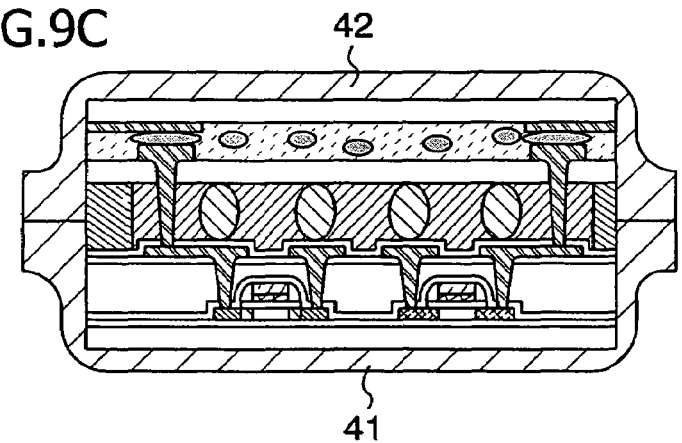

In the semiconductor device having the above structure, a stacked body including a plurality of transistors 14 may be further sealed with a substrate (refer to FIG. 9C). In the shown structure, a substrate 41 is provided over the surface of the substrate 10, and a substrate 42 is provided over the surface of the substrate 59.

Embodiment 1

A substrate provided with a conductive layer will be explained with reference to FIGS. 10A and 10B. As a substrate provided with a conductive layer, for example, following two types of substrates are given. The conductive layer functions as an antenna or a connecting wiring.

Figure 10A:
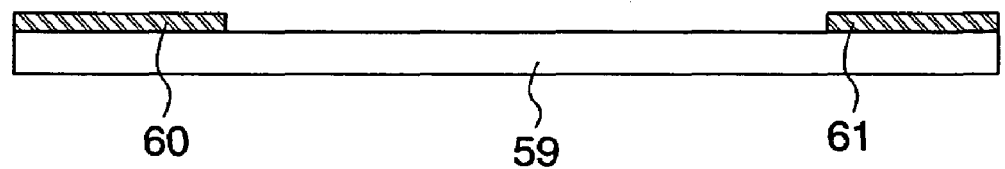
FIGS. 10A and 10B are views each explaining a semiconductor device of the present invention and a manufacturing method thereof.

One of them is a substrate 59 over which conductive layers 60 and 61 are provided (refer to FIG. 10A). The substrate 59 is formed by using polyimide, PET (polyethylene terephthalate), PEN (polyethylene naphthalate), PC (polycarbonate), PES (polyether sulfone), or the like. The conductive layers 60 and 61 are formed by using copper, silver, or the like. In addition, exposed portions of the conductive layers 60 and 61 are plated with gold or the like for preventing oxidation.

Figure 10B:
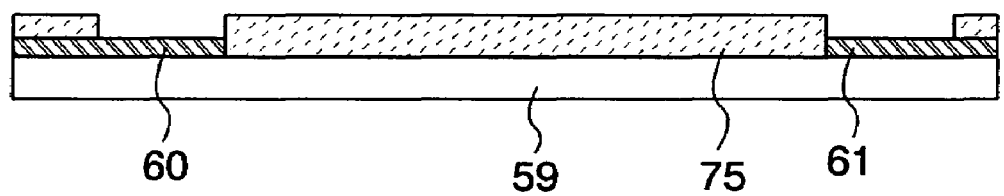

The other of them is a substrate 59 over which conductive layers 60 and 61, and a protective layer 75 are provided (refer to FIG. 10B). As the protective layer 75, one or both of a substrate and an insulating resin are provided. The substrate corresponds to polyimide, PET (polyethylene terephthalate), PEN (polyethylene naphthalate), PC (polycarbonate), or PES (polyether sulfone). The insulating resin corresponds to a liquid resist, an epoxy resin, a silicon resin, or a synthetic rubber based resin.

When the conductive layers 60 and 61 over the substrate 59 each function as an antenna, the shape of the conductive layers 60 and 61 is not particularly limited. As a shape, for example, a dipole shape, a circular shape (for example, a loop antenna), a spiral shape, a flat rectangular shape (for example, a patch antenna), or the like is given. In addition, a material for forming the conductive layers 60 and 61 is not particularly limited. For example, gold, silver, copper, or the like may be used as a material. Above all, silver may be preferably used because of its low resistance. Further, a manufacturing method thereof is not particularly limited either, and a sputtering method, a CVD method, a screen printing method, a droplet-discharge method (for example, an ink jet method), a dispenser method, or the like may be used.

It is to be noted that, when an antenna is directly attached to a surface of metal, eddy current is generated in the metal due to magnetic flux which pass through the surface of the metal. Such eddy current is generated in the reversed direction to a magnetic field of a reader/writer. Therefore, ferrite or a metal thin film sheet with high magnetic permeability and less loss of high frequency may be interposed between an antenna and a conductive layer to prevent generation of eddy current. This embodiment can be freely combined with the other embodiment modes or the other embodiments.

Embodiment 2

Figure 11:
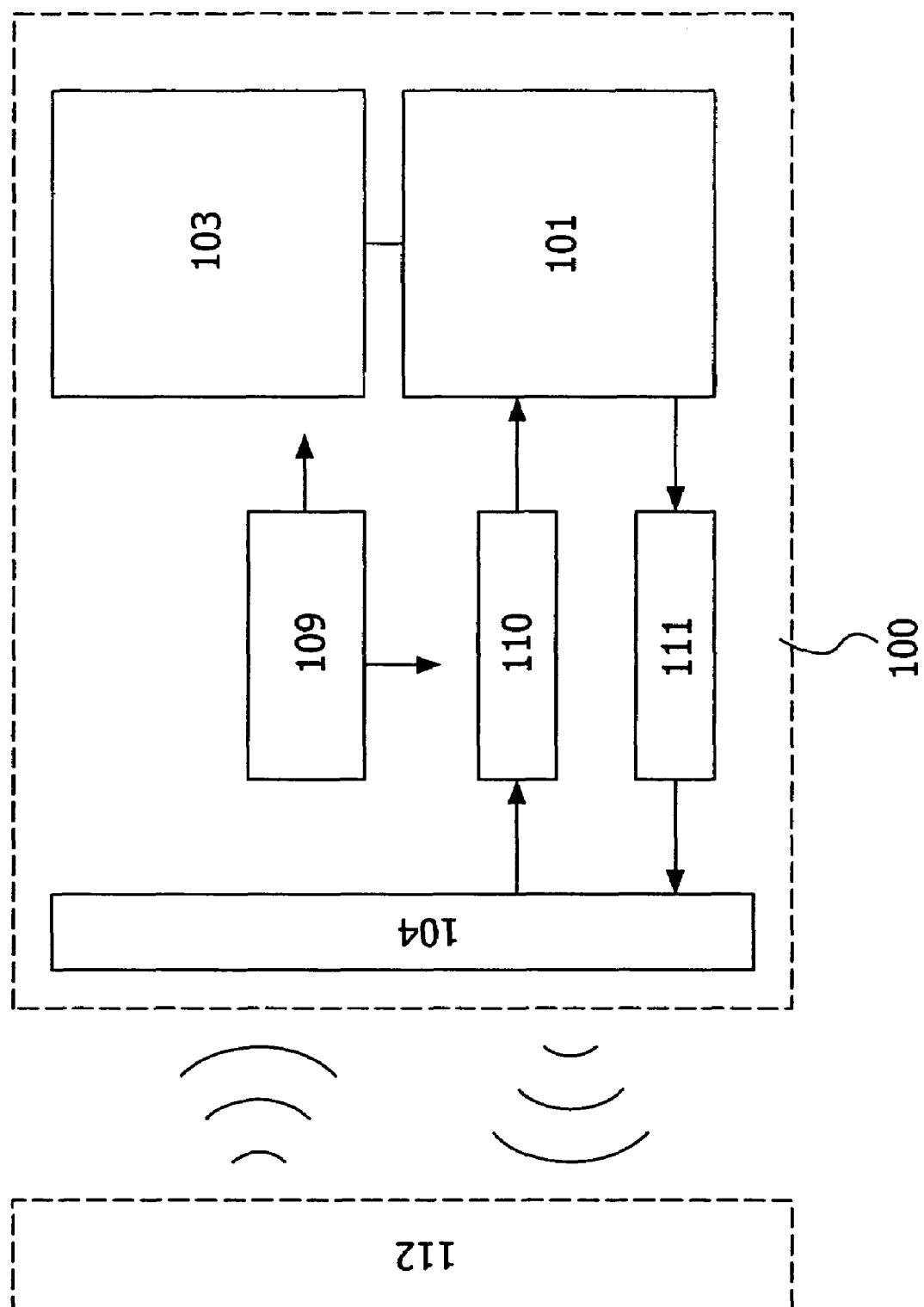
FIG. 11 is a diagram explaining a semiconductor device of the present invention.

A configuration of a semiconductor device of the present invention will be explained with reference to FIG. 11. A semiconductor device 100 of the present invention includes an arithmetic processing circuit 101, a memory circuit 103, an antenna 104, a power supply circuit 109, a demodulation circuit 110, and a modulation circuit 111. The semiconductor device 100 includes the antenna 104 and the power supply circuit 109 as necessary components. Other elements are provided appropriately in accordance with an application of the semiconductor device 100.

The arithmetic processing circuit 101 analyzes a command, controls the memory circuit 103, outputs data to be transmitted to the outside into the modulation circuit 111, or the like, based on a signal inputted from the demodulation circuit 110.

The memory circuit 103 includes a circuit including a memory element and a control circuit for controlling writing and reading of data. In the memory circuit 103, at least an identification number of the semiconductor device itself is stored. The identification number is used for distinguishing the semiconductor device from other semiconductor devices. In addition, the memory circuit 103 includes one or a plurality of memories selected from an organic memory, a DRAM (Dynamic Random Access Memory), a SRAM (Static Random Access Memory), a FeRAM (Ferroelectric Random Access Memory), a mask ROM (Read Only Memory), a PROM (Programmable Read Only Memory), an EPROM (Electrically Programmable Read Only Memory), an EEPROM (Electrically Erasable Programmable Read Only Memory), and a flash memory. The organic memory has a structure in which a layer containing an organic compound is interposed between a pair of conductive layers. Since the organic memory has a simple structure, a manufacturing process can be simplified and cost can be reduced. In addition, by the simple structure, an area of a stacked body can be easily reduced and high integration can be easily achieved. Further, there are also advantages that the organic memory is nonvolatile and does not require incorporation of a battery. Accordingly, it is preferable to use the organic memory for the memory circuit 103.

The antenna 104 converts a carrier wave supplied from a reader/writer 112 into an alternating electrical signal. In addition, load modulation is applied from the modulation circuit 111. The power supply circuit 109 generates power supply voltage by using the alternating electrical signal converted by the antenna 104 and supplies the power supply voltage to each circuit.

The demodulation circuit 110 demodulates the alternating electrical signal converted by the antenna 104 and supplies the demodulated signal to the arithmetic processing circuit 101. The modulation circuit 111 applies load modulation to the antenna 104, based on a signal supplied from the arithmetic processing circuit 101.

The reader/writer 112 receives the load modulation applied to the antenna 104 as a carrier wave. In addition, the reader/writer 112 transmits the carrier wave to the semiconductor device 100. It is to be noted that the carrier wave refers to an electromagnetic wave generated in the reader/writer 112. This embodiment can be freely combined with the other embodiment modes or the other embodiments.

Embodiment 3

A semiconductor device 125 of the present invention can be used in various objects and various systems by utilizing a function capable of transmitting and receiving an electromagnetic wave. The various objects include, for example, keys (refer to FIG. 12A), bills, coins, securities, bearer bonds, certificates (a driver's license, a resident's card, or the like), books, packing containers (a petri dish or the like, refer to FIG. 12B), personal accessories and ornaments (a bag, glasses, or the like, refer to FIG. 12C), packing and wrapping containers (wrapping paper, a bottle, or the like, refer to FIG. 12D), recording media (a disk, a video tape, or the like), vehicles (a bicycle or the like), foods, clothing, everyday articles, electronic devices (a liquid crystal display device, an EL display device, a television device, a portable terminal, or the like), and the like. The semiconductor device of the present invention is fixed by being attached to the surfaces of the objects having various forms as described above, or being embedded into the objects.

In addition, the various systems include a physical distribution-inventory management system, a certification system, a distribution system, a production record system, a book management system, and the like. By utilizing a function of the semiconductor device of the present invention, high-function, multifunction, and a high-added value of the system can be achieved. For example, the semiconductor device of the present invention is provided inside an identification card, and a reader/writer 121 is provided at an entrance of a building or the like (refer to FIG. 12E). The reader/writer 121 reads an identification number inside the identification card that every person possesses and supplies information related to the identification number that has been read to a computer 122. The computer 122 determines whether to permit the person's entrance or exit, based on the information supplied from the reader/writer 121. In this manner, by using the semiconductor device of the present invention, an entrance-exit management system, in which high-function and a high-added value are achieved, can be provided. This embodiment can be freely combined with the other embodiment modes or the other embodiments.

Embodiment 4

A semiconductor device of the present invention has a transistor. A semiconductor layer included in the transistor is formed through following manufacturing process, for example. First, an amorphous semiconductor layer is formed by a sputtering method, an LPCVD method, a plasma CVD method, or the like. Subsequently, the amorphous semiconductor layer is crystallized by a laser crystallization method, a thermal crystallization method using an RTA (Rapid Thermal Anneal) method or an annealing furnace, a thermal crystallization method using a metal element promoting crystallization, a method in which the thermal crystallization method using a metal element promoting crystallization and the laser crystallization method are combined, or the like to form a crystalline semiconductor layer. Then, the obtained crystalline semiconductor layer is patterned into a desired shape.

The semiconductor layer included in the transistor is preferably formed by a combination of a crystallization method with heat treatment and a crystallization method in which irradiation of a continuous wave laser beam or a laser beam oscillating with a frequency of 10 MHz or higher is performed. By irradiating the semiconductor layer with a continuous wave laser beam or a laser beam oscillating with a frequency of 10 MHz or higher, the surface of the crystallized semiconductor layer can be planarized. In addition, by planarizing the surface of the semiconductor layer, a gate insulating layer, which is formed in an upper layer of the semiconductor layer, can be thinned. Further, pressure resistance of the gate insulating layer can be improved.

In addition, the gate insulating layer included in the transistor may be formed by performing plasma treatment to the semiconductor layer, whereby the surface of the semiconductor layer is oxidized or nitrided. For example, plasma treatment is employed, in which a mixed gas containing a rare gas such as He, Ar, Kr, or Xe and oxygen, oxidized nitrogen, ammonia, nitrogen, hydrogen, and the like is introduced. In this case, when excitation of plasma is performed by introducing a microwave, plasma with a low electron temperature and high density can be generated. The surface of the semiconductor layer can be oxidized or nitrided by oxygen radicals (OH radicals may be included) or nitrogen radicals (NH radicals may be included) generated by this high density plasma. In other words, an insulating layer having a thickness of 5 to 10 nm is formed over the semiconductor layer by such treatment using high density plasma. Since a reaction in this case is a solid-phase reaction, an interface state density between the insulating layer and the semiconductor layer can be extremely low. In such high density plasma treatment, since the semiconductor layer (crystalline silicon or polycrystalline silicon) is directly oxidized (or nitrided), variation in a thickness of a gate insulating layer that is formed can be made to be extremely small. In addition, a semiconductor layer in a crystal grain boundary of crystalline silicon is not oxidized too much, and a very desirable state can be obtained. In other words, in the high density plasma treatment described here, by solid-phase oxidation of the semiconductor layer surface, a gate insulating layer which has favorable uniformity and low interface state density can be formed without excessive oxidation in a crystal grain boundary.

As for the gate insulating layer, only the insulating layer formed by high density plasma treatment may be used, or an insulating layer of silicon oxide, silicon oxynitride, silicon nitride, or the like may be deposited and stacked over the above insulating layer by a CVD method using plasma or a thermal reaction. In any case, characteristic variation can be reduced in the transistor including the insulating layer formed by high density plasma as the gate insulating layer or part of the gate insulating layer.

Further, a semiconductor layer, which is crystallized by being scanned in one direction while being irradiated with a continuous wave laser beam or a laser beam oscillating with a frequency of 10 MHz or higher, has a characteristic that crystals are grown in a scanning direction of the beam. A transistor in which characteristic variation is reduced and field effect mobility is high can be obtained by arranging the transistor so that the scanning direction is aligned with a channel length direction (a direction in which carriers are flown when a channel forming region is formed) and by employing the above-described method to form a gate insulating layer.

It is to be noted that a semiconductor layer, a gate insulating layer, and other insulating layer included in a transistor are formed by plasma treatment in some cases. Such plasma treatment is preferably performed with electron density of $1 \times 10^{11}$ cm$^{-3}$ or higher and an electron temperature of plasma of 1.5 eV or lower. In more detail, the plasma treatment is preferably performed with electron density of $1 \times 10^{11}$ cm$^{-3}$ or higher and $1 \times 10^{13}$ cm$^{-3}$ or lower and an electron temperature of plasma of 0.5 eV or higher and 1.5 eV or lower.

When plasma has high electron density and a low electron temperature in the vicinity of an object to be processed (for example, a semiconductor layer, a gate insulating layer, and the like included in a transistor), the object to be processed can be prevented from being damaged due to plasma. In addition, since electron density of plasma is as high as $1 \times 10^{11}$ cm$^{-3}$ or higher, oxide or nitride, which is formed by oxidizing or nitriding an object to be irradiated using plasma treatment, is superior in uniformity of a thickness or the like and can be denser, compared with a thin film formed by a CVD method, a sputtering method, or the like. In addition, since the electron temperature of the plasma is as low as 1.5 eV or lower, oxidizing treatment or nitriding treatment can be performed at a lower temperature, compared with conventional plasma treatment or a thermal oxidation method. For example, even when plasma treatment is performed at a temperature lower than a strain point of a glass substrate by 100° C. or more, oxidizing treatment or nitriding treatment can be sufficiently performed.

This application is based on Japanese Patent Application serial no. 2005-193202 filed in Japan Patent Office on Jun. 30, 2005, the entire contents of which are hereby incorporated by reference.

What is claimed is:

1. A method for manufacturing a semiconductor device, comprising the steps of:
    forming a transistor over one surface of a first substrate;
    forming a first insulating layer over the transistor;
    forming a first conductive layer electrically connected to a source or a drain of the transistor through an opening provided in the first insulating layer;
    forming a second insulating layer over the first conductive layer;
    forming a second conductive layer electrically connected to the first conductive layer through an opening provided in the second insulating layer, the second conductive layer functioning as an antenna;
    providing a second substrate over the second insulating layer so that a surface of the second insulating layer is in contact with one surface of the second substrate;
    grinding the other surface of the first substrate and the other surface of the second substrate until a thickness of each of the first substrate and the second substrate becomes 100 µm or less;
    polishing the other surface of the first substrate and the other surface of the second substrate until the thickness of each of the first substrate and the second substrate becomes 2 µm or more and 50 µm or less; and
    forming a stacked body including the first substrate, the transistor, and the second substrate by cutting the first substrate, the first insulating layer, the second insulating layer, and the second substrate.

2. The method for manufacturing a semiconductor device according to claim 1, wherein at least one of a sealing material and a spacer is formed between the first substrate and the second substrate.

3. The method for manufacturing a semiconductor device according to claim 1, wherein at least one of the first substrate and the second substrate is a glass substrate.

4. A method for manufacturing a semiconductor device, comprising the steps of:
    forming a transistor over one surface of a first substrate;
    forming a first insulating layer over the transistor;
    forming a first conductive layer electrically connected to a source or a drain of the transistor through an opening provided in the first insulating layer;
    forming a second insulating layer over the first conductive layer;
    forming a second conductive layer electrically connected to the first conductive layer through an opening provided in the second insulating layer, the second conductive layer functioning as an antenna;
    forming a third insulating layer over the second conductive layer;
    providing a second substrate over the third insulating layer so that a surface of the third insulating layer is in contact with one surface of the second substrate;
    grinding the other surface of the first substrate and the other surface of the second substrate until a thickness of each of the first substrate and the second substrate becomes 100 µm or less;
    polishing the other surface of the first substrate and the other surface of the second substrate until the thickness of each of the first substrate and the second substrate becomes 2 µm or more and 50 µm or less; and
    forming a stacked body including the first substrate, the transistor, and the second substrate by cutting the first substrate, the first insulating layer, the second insulating layer, the third insulating layer and the second substrate.

5. The method for manufacturing a semiconductor device according to claim 4, wherein at least one of a sealing material and a spacer is formed between the first substrate and the second substrate.

6. The method for manufacturing a semiconductor device according to claim 4, wherein at least one of the first substrate and the second substrate is a glass substrate.

7. A method for manufacturing a semiconductor device, comprising the steps of:
    forming a transistor over one surface of a first substrate;
    forming a first insulating layer over the transistor;
    forming a first conductive layer electrically connected to a source or a drain of the transistor through an opening provided in the first insulating layer;

forming a second insulating layer over the first conductive layer;

forming a second conductive layer electrically connected to the first conductive layer through an opening provided in the second insulating layer, the second conductive layer functioning as an antenna;

providing a second substrate over the second insulating layer so that a surface of the second insulating layer is in contact with one surface of the second substrate;

grinding the other surface of the first substrate and the other surface of the second substrate until a thickness of each of the first substrate and the second substrate becomes 100 μm or less; and polishing the other surface of the first substrate and the other surface of the second substrate until the thickness of each of the first substrate and the second substrate becomes 2 μm or more and 50 μm or less.

8. The method for manufacturing a semiconductor device according to claim 7, wherein at least one of a sealing material and a spacer is formed between the first substrate and the second substrate.

9. The method for manufacturing a semiconductor device according to claim 7, wherein at least one of the first substrate and the second substrate is a glass substrate.

* * * * *